(12) United States Patent
Kellner-Werdehausen et al.

(10) Patent No.: US 8,018,064 B2
(45) Date of Patent: Sep. 13, 2011

(54) ARRANGEMENT INCLUDING A SEMICONDUCTOR DEVICE AND A CONNECTING ELEMENT

(75) Inventors: Uwe Kellner-Werdehausen, Leutenbach (DE); Reiner Barthelmess, Soest (DE); Hans-Joachim Schulze, Ottobrunn (DE); Heinrich Gerstenkoeper, Warstein (DE); Ralf Joerke, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 645 days.

(21) Appl. No.: 11/756,110

(22) Filed: May 31, 2007

(65) Prior Publication Data

US 2008/0296774 A1    Dec. 4, 2008

(51) Int. Cl.
*H01L 23/52* (2006.01)
*H01L 21/60* (2006.01)
(52) U.S. Cl. ..................................................... 257/773
(58) Field of Classification Search .......... 257/107–182, 257/620, E21.122, 773, 211, 685, 686, 723, 257/726, E25.031, E25.032, E23.042
See application file for complete search history.

(56) References Cited

U.S. PATENT DOCUMENTS

| 7,135,782 | B2* | 11/2006 | Nishikawa | 257/796 |
| 7,476,972 | B2* | 1/2009 | Takahashi | 257/773 |
| 2002/0084524 | A1* | 7/2002 | Roh et al. | 257/738 |
| 2006/0076683 | A1* | 4/2006 | Nishida | 257/758 |
| 2006/0197229 | A1* | 9/2006 | Osumi et al. | 257/773 |

FOREIGN PATENT DOCUMENTS

| WO | WO20070711285 | * | 6/2007 |
| WO | WO20070711285 A1 | * | 6/2007 |

* cited by examiner

*Primary Examiner* — Dao H Nguyen
*Assistant Examiner* — Tram H Nguyen
(74) *Attorney, Agent, or Firm* — Dicke, Billig & Czaja, PLLC

(57) ABSTRACT

An integrated circuit and an arrangement including a semiconductor device and a connecting element and method for producing such an arrangement is disclosed. One embodiment provides a semiconductor element having a first contact face and a second contact face. The first contact face and the second contact face extend in a first lateral direction. An electrically conductive connecting element which has a third contact face electrically contacts the semiconductor element. The connecting element includes a trench system. A first trench of this trench system extends from the third contact face into the connecting element.

38 Claims, 12 Drawing Sheets

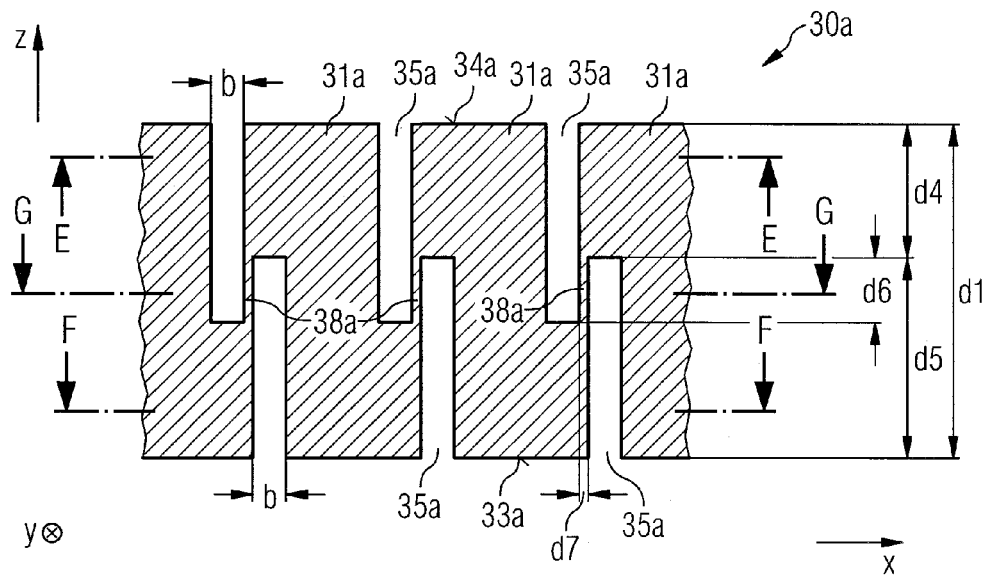
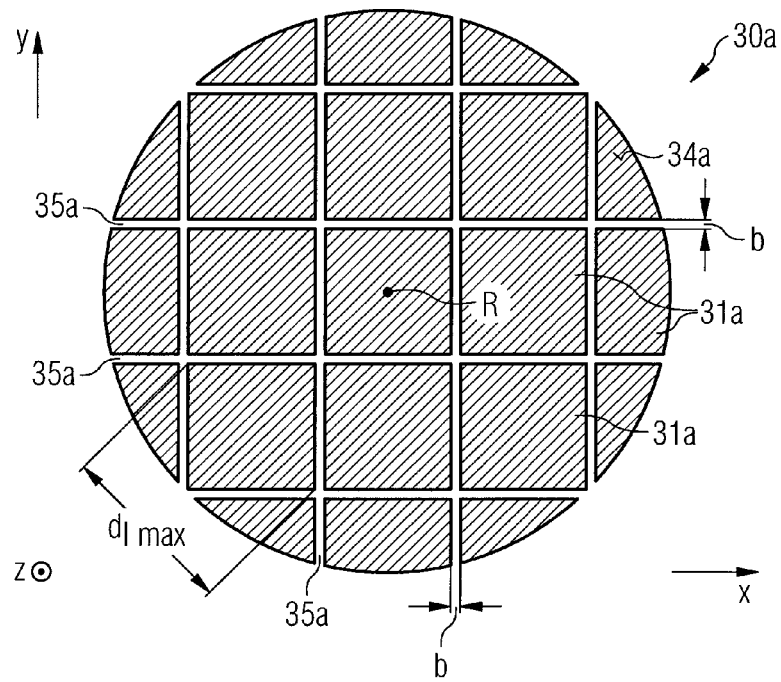

ARRANGEMENT INCLUDING A SEMICONDUCTOR DEVICE AND A CONNECTING ELEMENT

BACKGROUND

The invention relates to a semiconductor arrangement including a semiconductor device and a connecting element, and to a method for producing a semiconductor arrangement.

To achieve high ampacity, power semiconductor arrangements, e.g., power thyristors or power diodes, usually include an extensive semiconductor element. The semiconductor element includes a semiconductor body, e.g., a wafer, substantially consisting of a semiconductor material, e.g., silicon or silicon carbide. The semiconductor body may include metallizations for forming electrical contacts, electrical lines, field plates, etc.

For electrically contacting a contact face of the semiconductor element, highly conductive connecting elements like disks made of copper, aluminum or other metals and alloys thereof are used. One or more of such connecting elements are arranged adjacent to one another and are pressed against one another and against the contact face to form pressure contacts. Instead of applying pressure for the connecting elements contacting each other and the semiconductor element, the respective elements may be joined fixedly.

Generally, the expansion coefficients of a semiconductor element and of a metallic connecting element differ from one another. During normal operation, the temperature of the semiconductor device may increase from ambient temperature to high temperatures, e.g., 60° C. to 125° C., which causes thermo-mechanical stresses between the semiconductor element and the metal of the connecting element. Under certain circumstances, variations of temperature between −40° C. and +160° C. may occur. In a worst case scenario the semiconductor element may crack due to these thermomechanical stresses. The strength of the stress increases with the area of contact between the semiconductor element and the metal. For example, in high power semiconductor arrangements, the semiconductor element may be a wafer having a diameter of, e.g., more then or equal to 4 inches, 5 inches or even 6 inches.

For a pressure contact, a further problem caused by a different thermal expansion is abrasion that occurs due to a relative movement between adjacent pressure contacted components if the arrangement undergoes large number of temperature cycles.

Typically, such semiconductor devices include two contact faces being arranged on opposite sides of a semiconductor body. Each of these contact faces may be electrically contacted in a way as described above.

The problem of cracking and abrasion may be overcome by inserting a compensating element between the semiconductor element and the connecting element, where the compensating element may be a disk made of molybdenum. Molybdenum is tougher than copper so that the thermomechanical stress affecting the semiconductor device is reduced. However, thick compensating elements increase the costs for producing the semiconductor arrangement and its weight.

For these and other reasons, there is a need for the present invention.

SUMMARY

Embodiments of the invention provide a semiconductor arrangement. One embodiment provides a substantially flat semiconductor element having a first contact face and a second contact face opposite the first contact face, the first contact face and the second contact face extending in at least a first lateral direction. An electrically conductive connecting element is provided, electrically contacting the semiconductor body, where the connecting element has a third contact face and a fourth contact face opposite the third contact face, and where at least a first trench extends from the third contact face into the connecting element, thereby dividing the connecting element into sections which are thermomechanically uncoupled.

As thermomechanical stress and abrasion between the semiconductor element and a section of the connecting element caused by temperature cycling depends on the length of the section in the first lateral direction, it is possible to reduce the thermal stress and abrasion by increasing the number of sections, i.e. by increasing the number of trenches.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 10 illustrates a vertical cross-sectional view of a section of a connecting element as used in the arrangement according to FIG. 9.

FIG. 11 illustrates a horizontal cross-sectional view of a section through a connecting element in a section plane A-A according to FIG. 3, in a section plane B-B according to FIG. 5, in section planes C-C and D-D according to FIG. 7 and in section planes E-E and F-F according to FIG. 10, where the trenches form a rectangular grid.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
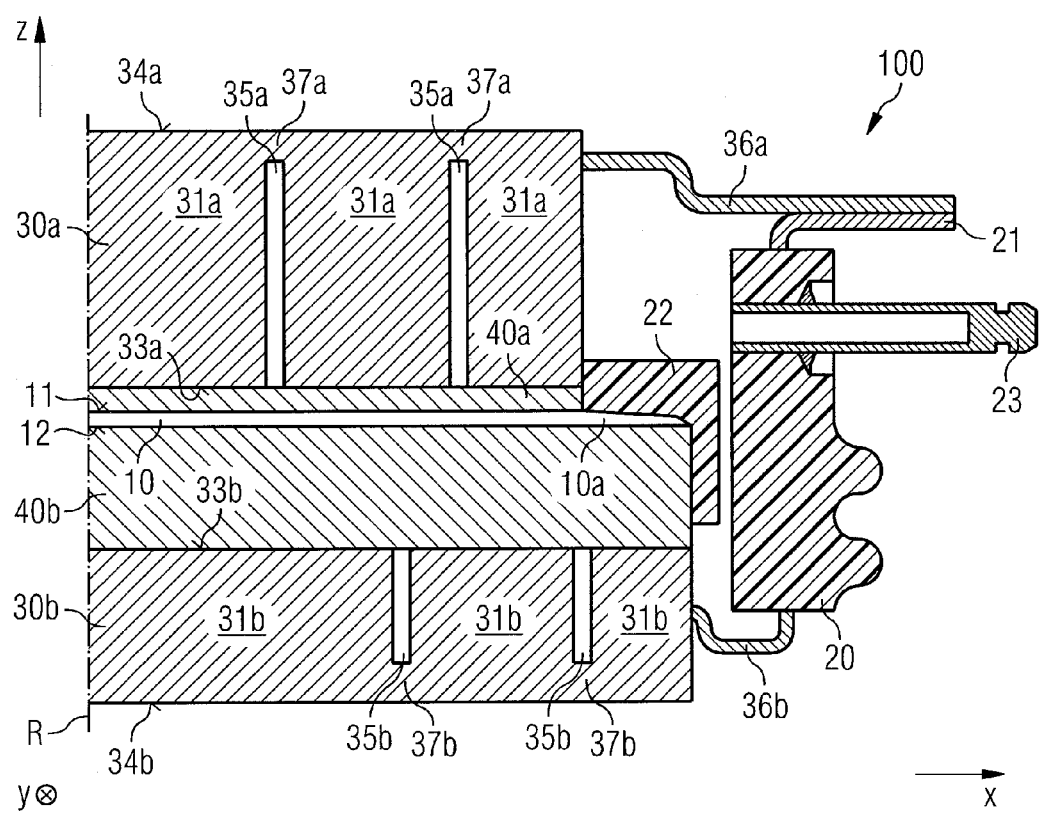
FIG. 1 illustrates a vertical cross-sectional view of a section of a semiconductor arrangement including a semiconductor element and two connecting elements, with each of the connecting elements having a contact face which is facing towards the semiconductor element and from which trenches extend into the respective connecting element.

FIG. 1 is a vertical cross-sectional view of a section through a semiconductor arrangement that is realized as a thyristor 100. The thyristor 100 includes a semiconductor element 10, connecting elements 30a, 30b, and compensating elements 40a, 40b. The compensation element 40a is arranged between the semiconductor element 10 and the connecting element 30a, the compensation element 40b between the semiconductor element 10 and the connecting element 30b. To form a housing of the thyristor 100, the connecting elements 30a, 30b and a ceramic ring 20 are fixedly joined to one another by metallic flanges 36a, 36b and 21. In order to avoid sparkovers if a high electrode voltage is applied to the connection elements 30a, 30b, a passivation 22, e.g., made of or including ultrapure polysiloxane (silicone), covers the edge 10a of the semiconductor element 10 and the adjacent lateral faces of the compensating elements 40a, 40b.

Except for a lead through 23 for a gate line and for the gate line itself in case of an electrically triggerable thyristor, and except for trenches 35a, 35b formed in the connecting elements 30a, 30b, respectively, the thyristor 100 may be substantially rotationally symmetric with respect to an axis R. The lead through 23 is optional, as not each thyristor, e.g., an optically triggerable thyristor, requires a gate line. Further, a lead through 23 is not required if the device is formed as a diode instead of a thyristor.

The anode-sided connecting element 30b may have a diameter which is greater than or equal to the diameter of the cathode-sided connecting element 30a. The semiconductor element 10 is made from a wafer and includes a semiconductor material, e.g., silicon, silicon carbide, and includes a number of doped areas. On opposite sides the semiconductor element 10 has contact faces 11 and 12 which may be metallized, e.g., with aluminum. The faces 11 and 12 extend parallel to a plane which is defined by lateral directions x, y, which may be perpendicular to one another. To form an edge termination the edge 10a of the semiconductor element 10 is tapered.

The thyristor 100 further includes two connecting elements 30a, 30b. Each of the connecting elements 30a, 30b has a contact face 33a, 33b, respectively, which is facing towards the semiconductor element 10. The connecting elements 30a, 30b are used as electrical and thermal connections to externally connect the semiconductor element 10 to an electrical power circuit which is to be switched by the thyristor 100. Therefore, the connecting elements 30a, 30b have a low resistance and may, e.g., be made of or include copper, aluminum or other metals, or alloys thereof.

Optionally between each of the connecting elements 30a, 30b and the semiconductor element 10, a further connecting element 40a, 40b, respectively, may be arranged. In the following, connecting elements 40a, 40b are denoted as compensating elements 40a, 40b as they serve to reduce thermo-mechanical stresses between the semiconductor element 10 and the connecting elements 30a, 30b, respectively. The connecting element 30b, the compensating element 40b, the semiconductor element 10, the compensating element 40a and the connecting element 30a are arranged consecutively in a vertical direction z which is perpendicular to both lateral directions x and y.

The compensating elements 40a, 40b may fixedly be joined with the contact faces 11 and 12, respectively. One possibility to realize such a connection is a low temperature connecting method in which the connection is formed at temperatures below 300° C. In such a low temperature connecting method at least on of the faces which are to be joined, is coated with metal, e.g., gold or silver. Then, the pieces are joined by pressing the coated faces against one another at comparatively low temperatures, e.g., less than 300° C. Before coating them the pieces may optionally be polished. Then, additional layers, e.g., one or more adhesive base layers, for example of titanium, may optionally be deposited on the polished faces. Such low temperature connecting methods are described in more detail in the German patent application DE 3633266 A1.

Instead of using a low temperature connecting method, the contacts between one or both of the compensating elements 40a, 40b may be realized as pressure contacts. Further, the contact between the connecting element 30a and the compensating element 40a and/or the contact between the connecting element 30b and the compensating element 40b may be realized as pressure contact or as low temperature connection as described above.

For its external connection the thyristor 100 is clamped under high pressure, e.g., 0.9 kN/cm² to 1.3 kN/cm² (1305 psi to 1885 psi), with its outer contact faces 34a, 34b between external contacts which are not illustrated in FIG. 1. Such a high pressure is required to obtain a low electrical and thermal resistance between the external contacts and the respective outer connecting elements 30a, 30b, and between pressure contacted components 30a/40a, 40a/10, 10/40b, 40b/30b of the thyristor 100.

From the contact faces 30a, 33b trenches 35a, 35b extend into the respective connecting element 30a, 30b. Optionally, one or more trenches may extend also from the contact faces 34a and/or 34b into the connecting elements 30a and 30b, respectively.

The distance between the contact face 34a and the bottoms of one, some or all of the trenches 35a and/or the distance between the contact face 34b and the bottoms of one, some or all of the trenches 35b may be less than or equal to a predefined value, e.g., 5 mm.

To ensure mechanical stability, the distance between the contact face 34a and the bottoms of one, some or all of the trenches 35a and/or the distance between the contact face 34b and the bottoms of one, some or all of the trenches 35b may be greater than or equal to a predefined value, e.g., 0.2 mm or 0.5 mm.

As explained above, the trenches 35a, 35b provide space to uncouple sections of the connecting elements 30a and 30b, respectively. However, as the connecting elements 30a, 30b need to conduct high electric currents, narrow trenches 35a, 35b will reduce its electric and thermal resistances. For instance, one, several or all of the trenches 35a, 35b may have a width from 1 percent to 10 percent of the thickness of the respective connecting element 30a, 30b. In addition, a minimum width of the trenches 35a, 35b, e.g., 0.2 mm, may be predefined.

The contact face 33a may be arranged between the contact faces 11 and 34a. Also, the contact face 33b may be arranged between the contact faces 12 and 34b. The trenches 35a divide the connecting element 30a into sections 31a which are uncoupled by the trenches 35a. Accordingly, the trenches 35b divide the connecting element 30b into sections 31b which are uncoupled by the trenches 35b. A remaining coupling between proximate sections 31a and between proximate sections 31b results from sections 37a and 37b, respectively, which are arranged below the bottoms of the trenches 35a, 35b. In order to obtain a sufficient uncoupling in all lateral directions the sections 31a and 31b are surrounded by the trenches 35a, 35, respectively.

Accompanied by providing trenches 35a, 35b, the contact faces 33a, 33b are divided into sub-areas. The maximum thermomechanical tension affecting a section 31a, 31b in a lateral direction x is reduced with the maximum length of the respective sub-area in the lateral direction x, i.e. with an increasing number of trenches 35a, 35b, the thermomechanical tensions can be further reduced.

Figure 2:
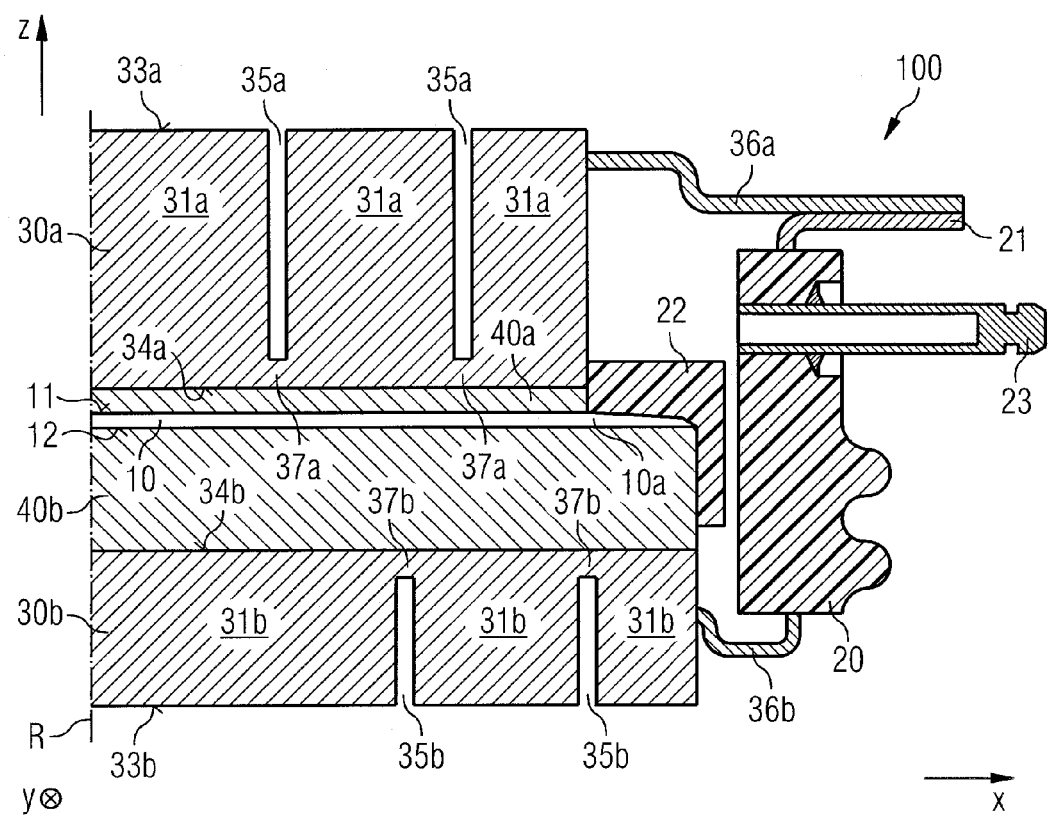
FIG. 2 illustrates a vertical cross-sectional view of a section of a semiconductor arrangement that is different from the semiconductor arrangement according to FIG. 1 in that the contact faces from which the trenches extend into the connecting element face away from the semiconductor body.

As can be seen from FIG. 2, at least one of the connecting elements 30a and 30b may also be arranged such that the contact faces 33a, 33b from which the trenches 35a, 35b extend into the respective connecting element 30a, 30b face away from the semiconductor element 10. Optionally, one or more trenches may extend also from the contact faces 34a and/or 34b into the connecting elements 30a and 30b, respectively. In FIG. 2, the contact face 34a is arranged between the contact faces 11 and 33a and the contact face 34b is arranged between the contact faces 12 and 33b.

The distance between the contact face 34a and the bottoms of one, some or all of the trenches 35a and/or the distance between the contact face 34b and the bottoms of one, some or all of the trenches 35b may be less than or equal to a predefined value, e.g., 5 mm.

To ensure mechanical stability, distance between the contact face 34a and the bottoms of one, some or all of the trenches 35a and/or the distance between the contact face 34b and the bottoms of one, some or all of the trenches 35b may be greater than or equal to a predefined value, e.g., 0.2 mm or 0.5 mm.

As in FIG. 1, the trenches 35a, 35b provide space to uncouple sections of the connecting elements 30a and 30b, respectively. Accordingly, one, several or all of the trenches 35a, 35b may have a width from 1 percent to 10 percent of the thickness of the respective connecting element 30a, 30b. In addition, a minimum width of the trenches 35a, 35b, e.g., 0.2 mm, may be predefined.

Figure 3:
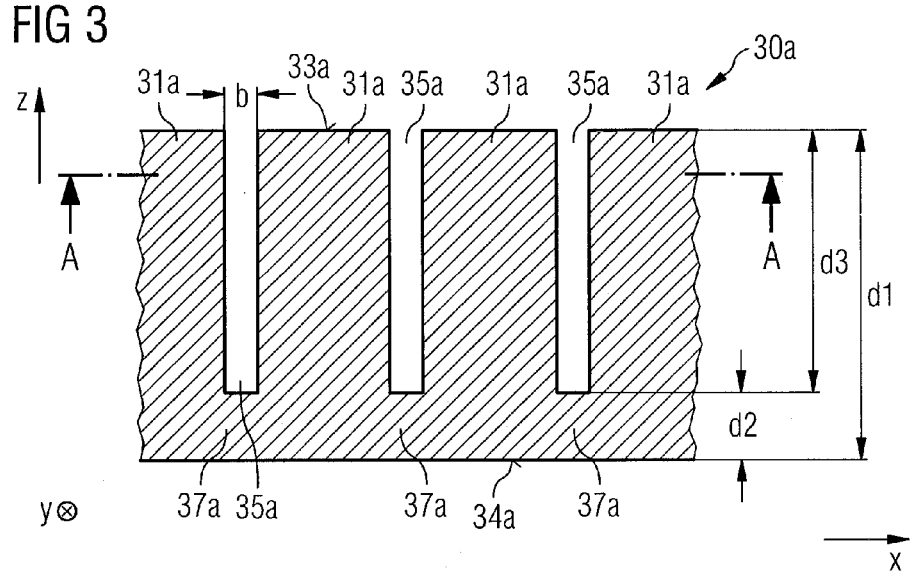
FIG. 3 illustrates a vertical cross-sectional view of a section of a connecting element as used in the arrangements according to FIGS. 1 and 2.

FIG. 3 is a vertical cross-sectional view of a section through a connecting element 30a as used in the thyristor according to FIGS. 1 and 2. The trenches 35a have a width b and extend from the contact face 33a into the connecting element 30a to a depth d3. Further, the connecting element 30a has a thickness d1. The ratio between the thickness d1 and the width b may be, e.g., from 10:1 to 100:1. The distance d2 between the bottoms of the trenches 35a and the contact face 34a determines the coupling between proximate sections 31a and may be, e.g., less than 5 mm. To ensure mechanical stability, the distance d2 may be greater than or equal to a predefined value, e.g., 0.2 mm or 0.5 mm.

Figure 4:
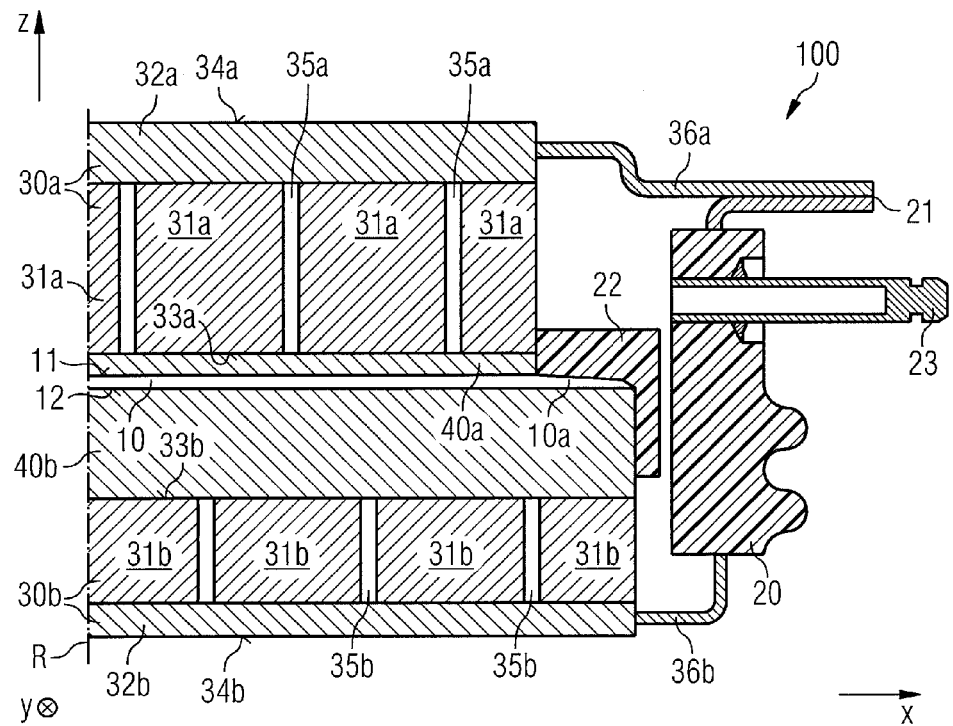
FIG. 4 illustrates a vertical cross-sectional view of a section of a semiconductor arrangement that is different from the semiconductor arrangement according to FIG. 1 in that each of the connecting elements is made of pieces which are spaced apart from one another and which are connected by a common connecting plate.
Figure 5:
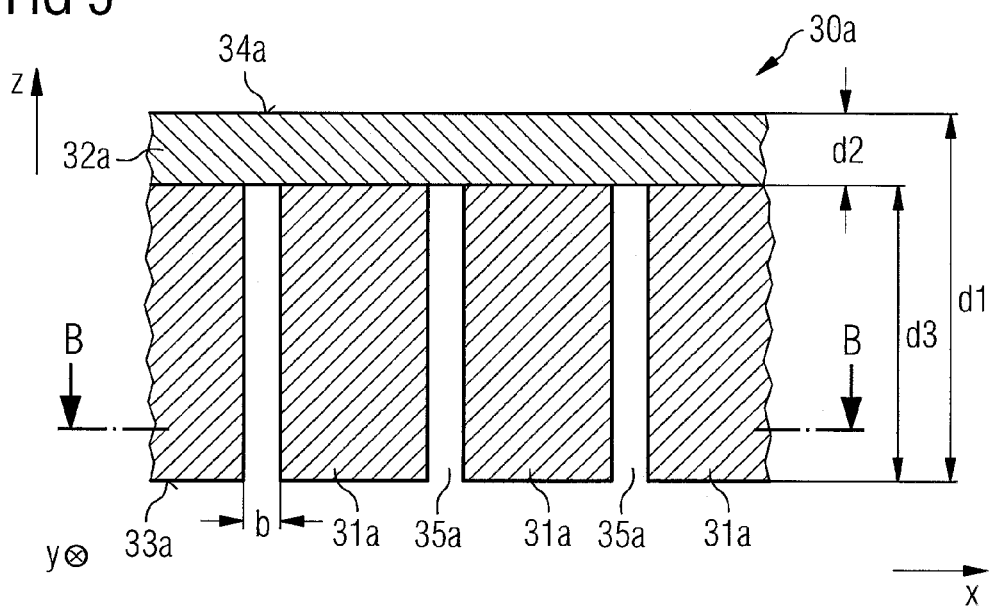
FIG. 5 illustrates a vertical cross-sectional view of a section of a connecting element as used in the arrangement according to FIG. 4.

Whereas the connecting elements 30a, 30b in FIGS. 1 to 3 are made in one piece, e.g., by countersinking or drilling the trenches into a basic raw material, e.g., a cylindrical disk, including or consisting of, e.g., copper, molybdenum or silver, the connecting element 30a of the thyristor according to FIG. 4 includes electrically conductive pieces 31a, 31b spaced apart from one another which are connected via common electrically conductive connecting plates 32a, 32b, respectively. The connecting element 30a of FIG. 4 is illustrated in FIG. 5 in more detail.

The connections between the electrically conductive pieces 31a, 31b and the respective connecting plate 32a, 32b may be realized as low temperature connections as described above. Alternatively, the connections may also be realized as hard-solder connections wherein the used solder has a melting point from 500° C. to 800° C.

The thickness d1 of the connecting element 30a, the distance d2 between the bottoms of the trenches 35a and the contact face 34a, the depth d3, the width b of the trench and the ratio between the thickness d1 and the width b may be chosen identical to the respective values as mentioned with respect to FIG. 3.

Figure 6:
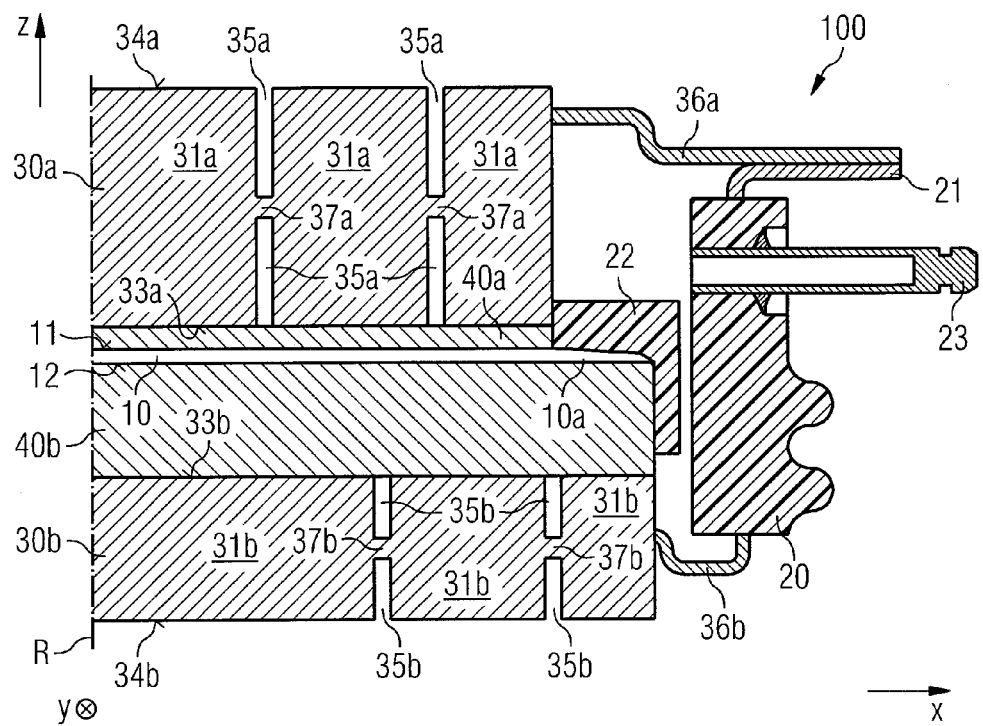
FIG. 6 illustrates a vertical cross-sectional view of a section of a semiconductor arrangement that is different from the semiconductor arrangements according to FIGS. 1, 2 and 3 in that each of the connecting elements includes trenches which are arranged opposite to one another and which extend into the connecting element from contact faces being arranged opposite to one another.

Another possible arrangement of trenches within a connecting element 30a, 30b can be seen from the thyristor according to FIG. 6. Trenches 35a, 35b extend from opposing contact faces 33a/34a, 33b/34b, respectively, into the respective connecting element 30a, 30b. As illustrated in FIG. 6 the trenches 35a, 35b may be arranged in pairs.

Figure 7:
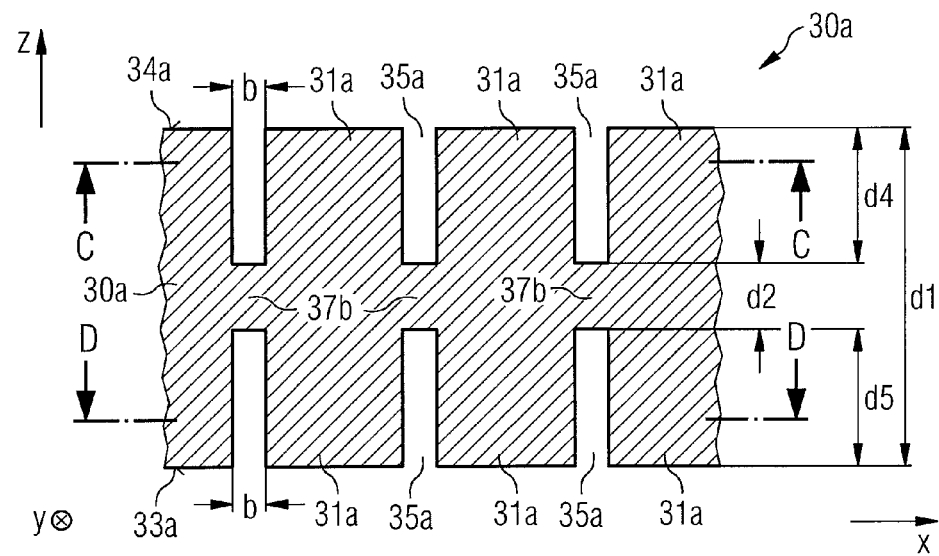
FIG. 7 illustrates a vertical cross-sectional view of a section of a connecting element as used in the arrangement according to FIG. 6.

FIG. 7 is a vertical cross-sectional view of a section of a connecting element 30a which may be used in an arrangement according to FIG. 6. Compared with the connecting element 30a of FIG. 6 the connecting element 30a of FIG. 7 has only a different number of trenches 35a. The connecting element 30a includes sections 31a which are largely uncoupled by the trenches 35a. The remaining coupling of the sections 31a results from sections 37a of connecting element 30a which are arranged between the bottoms of opposing trenches 35a and which have a thickness d2.

Figure 8:
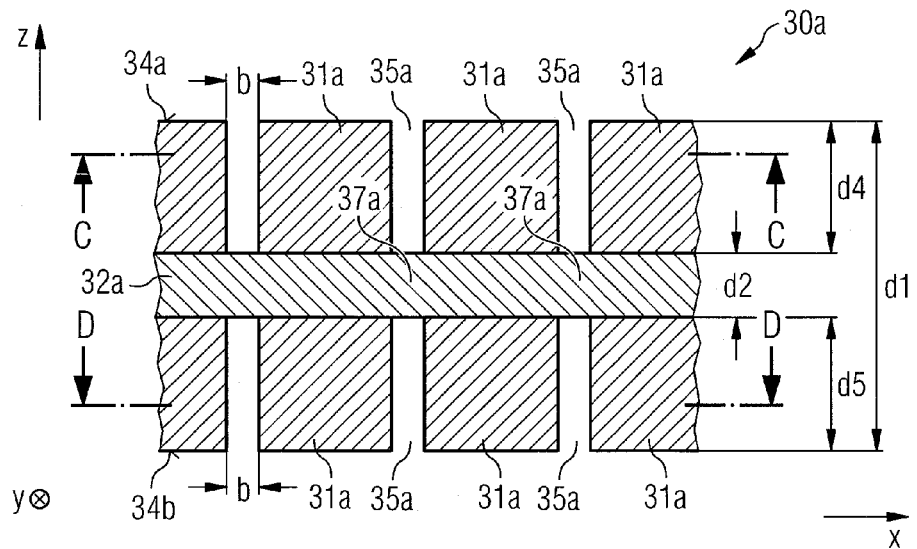
FIG. 8 illustrates a vertical cross-sectional view of a section of a connecting element which is made of pieces which are—spaced apart from one another—arranged on different sides of a common connecting plate and fixed thereto.

As can be seen from FIG. 8 instead of being made in one piece such a connecting element 30a may also be assembled from a number of pieces 31a spaced apart from one another which are joined to opposing faces of a common plate 32a. In this embodiment the pieces 31a correspond to the sections 31a as mentioned in FIGS. 1 and 2.

Except the arrangement of the sections 31a on opposing faces of the common plate 32a the connecting element 30a may be produced in the same way and by using the same materials as the connecting element 30a described with respect to FIG. 5.

In both FIG. 7 and FIG. 8 the trenches 35a extending from the contact face 34a into the connecting element 30a have a depth d4 and the trenches 35a extending from the contact face 33a into the connecting element 30a have a depth d5. The sum of d4 and d5 may be less than the thickness d1 of the connecting element 30a. The thickness d2 of the sections 37a between the bottoms of opposing trenches 35a may be less than or equal to a predefined value, e.g., 5 mm, and may be calculated as follows:

$$d2 = d1 - d4 - d5;$$

To ensure mechanical stability, the distance d2 may be greater than or equal to a predefined value, e.g., 0.2 mm or 0.5 mm. In lateral directions, the distance between one or more of the trenches 35a extending from the contact face 33a into the contact element 30a, and one ore more of the trenches 35a extending from the contact face 34a into the contact element 30a, may be less than or equal to a predefined value, e.g., 0.2 mm, 0.5 mm, 1 mm or 2 mm. To ensure mechanical stability, the respective distances may be greater than or equal to a predefined value, e.g., 0.2 mm or 0.5 mm.

Another embodiment is explained with reference to FIG. 9. Except the design of the connecting elements 30a, 30b the thyristor according to FIG. 9 may be identical to the thyristors described in FIGS. 1, 2, 4 and 6.

Figure 9:
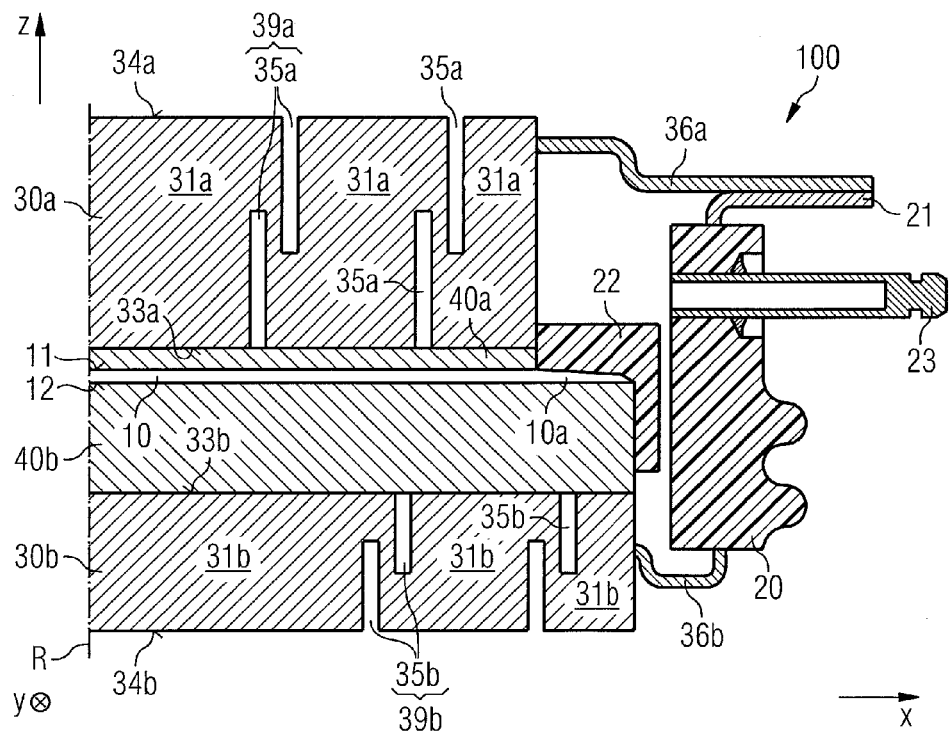
FIG. 9 illustrates a vertical cross-sectional view of a section of a semiconductor arrangement that is different from the semiconductor arrangement according to FIG. 2 in that additional trenches extend into the connecting element from the contact faces of connecting element facing to the semiconductor body.
Figure 12:
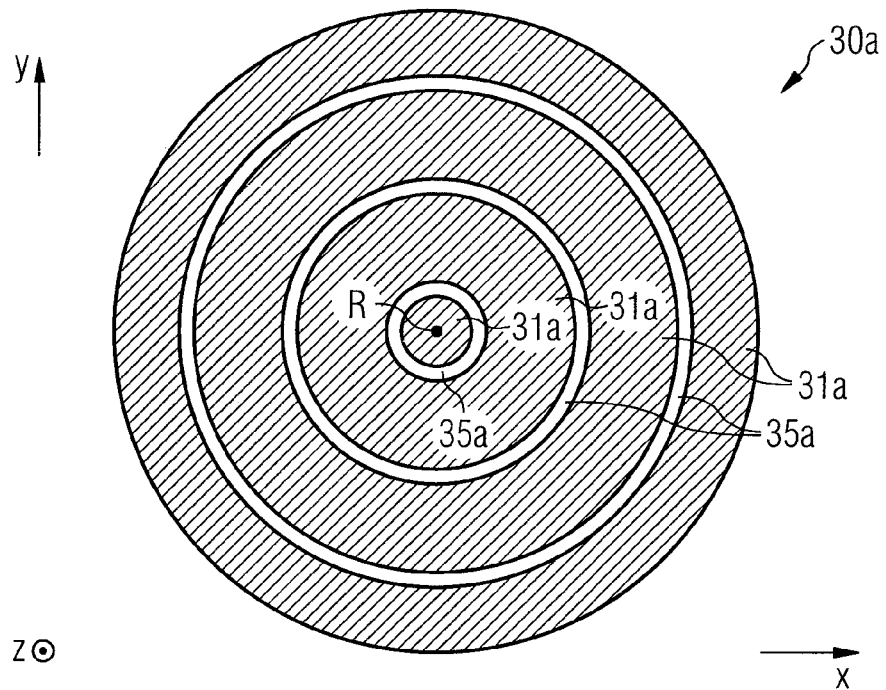
FIG. 12 illustrates a horizontal cross-sectional view of a section through a connecting element in a section plane A-A according to FIG. 3, in a section plane B-B according to FIG. 5, in section planes C-C and D-D according to FIG. 7 and in section planes E-E and F-F according to FIG. 10, wherein the trenches are formed as coaxial circular rings.

In FIG. 9 the trenches 35a, 35b, respectively, extending from different faces 33a/34a, 33b/34b into the same connecting element 30a, 30b, respectively, are arranged in pairs 39a, 39b, respectively. As exemplarily can be seen in more detail from FIG. 10 the trenches within one pair are offset from one another in the lateral direction x by a short distance and may be spaced apart from one another by a distance of d7 which may be, e.g., less than or equal to a predefined value, e.g., 1 mm or 2 mm. To ensure mechanical stability, the distance d7 may be greater than or equal to a predefined value, e.g., 0.2 mm or 0.5 mm. As in FIGS. 3, 5, 7 and 8 the width b of the trenches 35a may be less than or equal to 1 mm.

In FIG. 10 the trenches 35a extending from the contact face 34a into the connecting element 30a have a depth d4 and the trenches 35a extending from the contact face 33a into the connecting element 30a have a depth d5. The sum of d4 and d5 is greater than the thickness d1 of the connecting element 30a.

Between the bottoms of proximate trenches 35a and between the sidewalls of these trenches sections 38a are formed. In the vertical direction z the sections 38a have a dimension d6 which may be calculated as follows:

$$d6 = d4 + d5 - d1$$

and which may be greater than or equal to a predefined value, e.g., 0 mm, 2 mm, or 10 mm. The sections 31a proximate to these trenches 35a are resiliently coupled by the sections 38a.

So far the arrangement of trenches 35a, 35b within a connecting element 30a, 30b, respectively, has only been illustrated in vertical cross-sectional views. However, also in lateral directions the trenches may be arranged in different ways. FIGS. 11, 12, 13 and 15 exemplify different possible arrangements of trenches 35a with reference to a connecting element 30a as explained above.

In all embodiments described by example of FIGS. 1 to 10, the run in lateral directions, i.e. in a plane defined by the lateral directions x and y, of one, several or all trenches 35a, 35b extending from a contact face into a connecting element 30a, 30b may be straight or curved.

Two or more straight trenches of a connecting element may be arranged parallel to one another and/or be interconnected by one ore more interconnection trenches. Further, two trenches of a connecting element may run perpendicular to one another. For example, a connecting element may include a first set of trenches running parallel to one another and a second set of trenches running parallel to one another, wherein each trench of the first set runs perpendicular to each trench of the second set, i.e. the first set and the second set form a trench which is shaped as rectangular grid.

FIG. 11 illustrates a possible horizontal cross-sectional view of a connecting element 30a through section planes A in FIG. 3, B in FIG. 5, C and D in FIGS. 7 and 8, E and F in FIG. 10. The connecting element 30a includes a trench system including a first group of trenches 35a, wherein the trenches 35a of the first group run parallel to the lateral direction x. Further, the trenches 35a of a second group of trenches 35a run parallel to a second lateral direction y which is perpendicular to the direction x. The trenches 35a of the first group and the trenches 35a of the second group intersect and form a rectangular grid. Generally, each direction in the x-y-plane is named as "lateral direction". Due to the trenches 35a the contact face 34a is subdivided into sub-areas. The maximum dimension of such a sub-area in any of the possible lateral directions is $d_{lmax}$. The maximum lateral dimension $d_{lmax}$ of one, more or all sub-areas of the contact face 34a may be smaller than the diameter the connected semiconductor element divided by the square root of two, i.e. in case of a 4-inch wafer the maximum lateral dimension of a sub-area may be smaller than 71.8 mm, in case of a 5-inch wafer smaller than 89.8 mm and in case of a 6-inch wafer smaller than 107.7 mm. Any of these values as well as integer parts thereof with integer dividers 2, 3, 4, . . . also applies as maximum lateral dimension $d_{lmax}$ of at least one, more or all of the sub-areas.

To ensure that the electrical and thermal resistance of the arrangement does not increase to unacceptable values, in all embodiments the ratio between the sum of the areas of all sub-areas of a contact face and the area of the contact face (including the area of the trenches) may be greater than a predefined value, e.g., 0.8.

Optionally, one, several or all trenches extending from a contact face into the connecting element may be designed ring-shaped, e.g., like a circular or a rectangular ring. Particularly, two, several or all of such a trench system may be designed as coaxial rings which is exemplary explained with reference to FIG. 12 which illustrates a second possible horizontal cross-sectional view of a connecting element 30a through section planes A in FIG. 3, B in FIG. 5, C and D in FIGS. 7 and 8, E and F in FIG. 10. The trench system includes trenches 35a which are designed as circular rings and arranged coaxially to an axis R.

Figure 13:
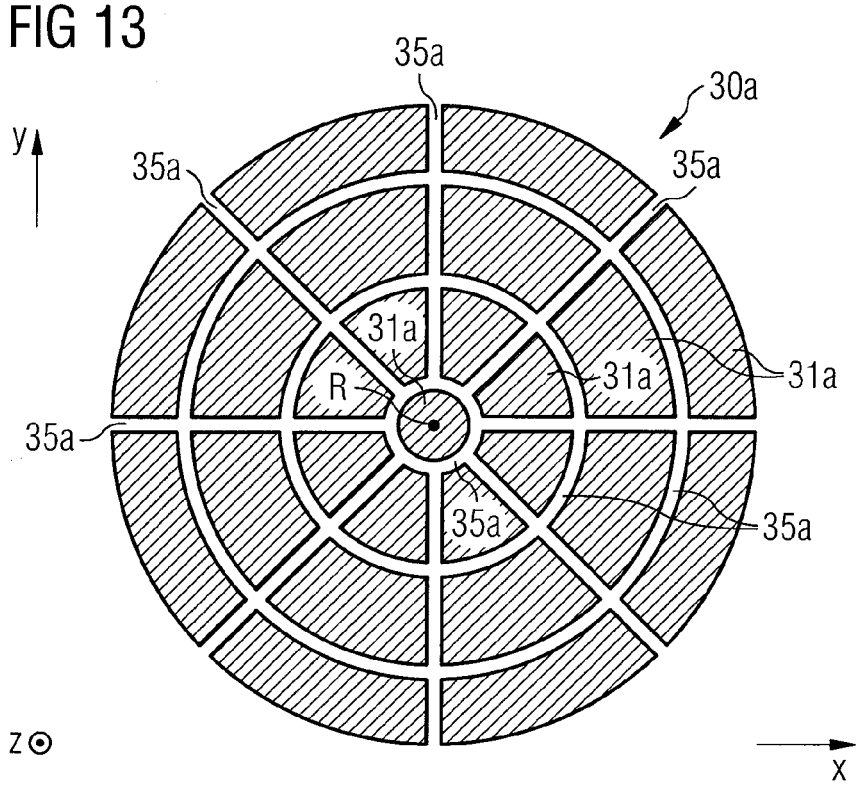
FIG. 13 illustrates a horizontal cross-sectional view of a section through a connecting element according to FIG. 12 in a section plane A-A according to FIG. 3, in a section plane B-B according to FIG. 5, in section planes C-C and D-D according to FIGS. 7 and 8 and in section planes E-E and F-F according to FIG. 10, wherein additional radial trenches intersect the ring-shaped trenches.

A third possible horizontal cross-sectional view of a connecting element 30a through section planes A in FIG. 3, B in FIG. 5, C and D in FIGS. 7 and 8, E and F in FIG. 10 is explained with reference to FIG. 13. The trenches 35a of a first group of trenches 35a are designed like the trenches explained in FIG. 12. The trenches 35a of a second group of trenches 35a are arranged spokes-like in radial directions and intersect and interconnect the trenches 35a of the first group.

Figure 14:
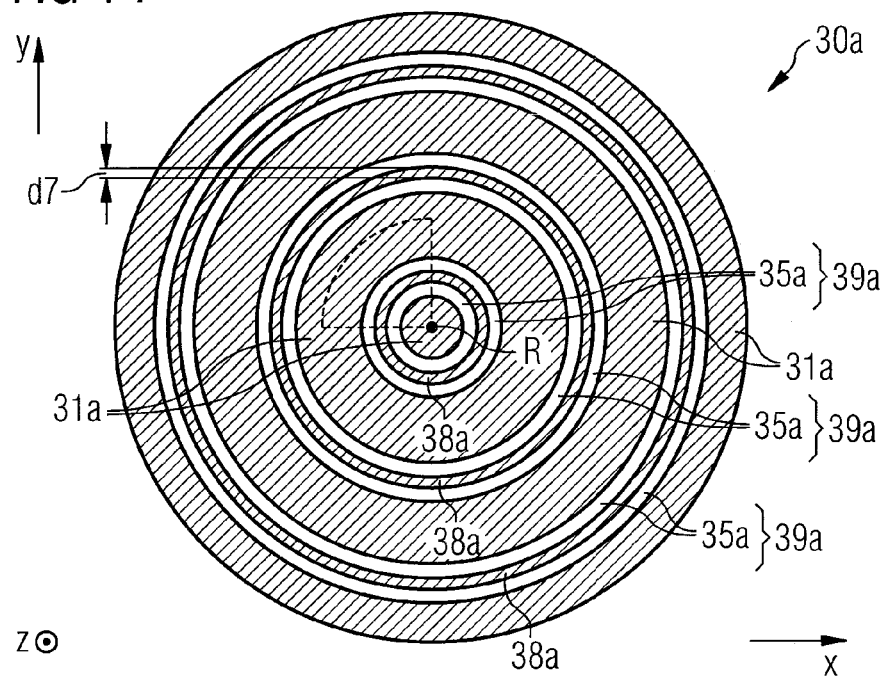
FIG. 14 illustrates a horizontal cross-sectional view through a connecting element including the section in a section plane G according to FIG. 10, wherein the system of trenches is formed from coaxial pairs of annuli.

A fourth possible horizontal cross-sectional view of a connecting element 30a through a section plane G in FIG. 10 is explained with reference to FIG. 14. The connecting element 30a includes three pairs 39a of trenches 35a. The trenches 35a of each pair 39a extend into the connecting element 30a from opposite faces. Between the trenches 35a of each pair 39a a section 38 via which proximate sections 31a are resiliently coupled. In FIG. 14 a dashed line indicates a section of the connecting element 30a which is illustrated in FIG. 15 in a three-dimensional perspective view.

Figure 15:
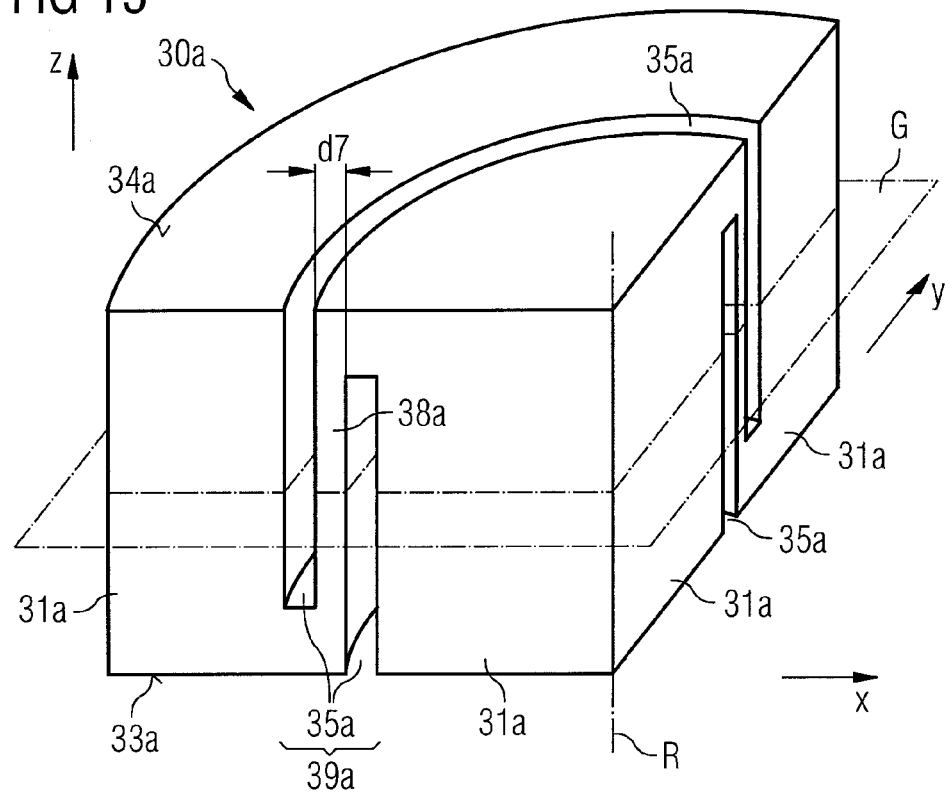
FIG. 15 illustrates a three-dimensional perspective view of a section of the connecting element according to FIGS. 10 and 14.
Figure 16:
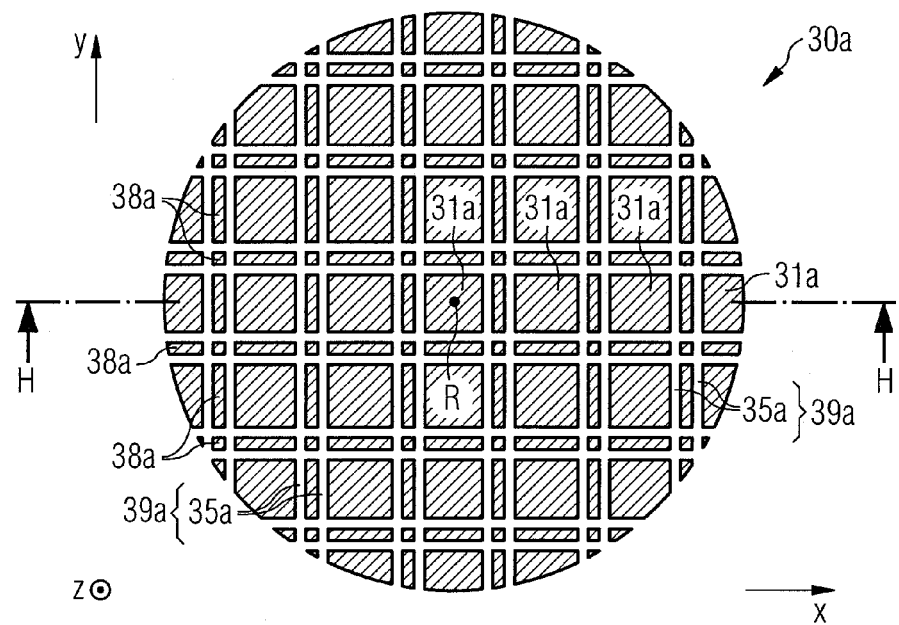
FIG. 16 illustrates a cross-sectional view of a connecting element including the section in a section plane G according to FIG. 10, wherein the system of trenches is formed from pairs of parallel trenches which are arranged as rectangular grid.

Instead of pairs 39a including coaxial circular ring-trenches 35a according to FIGS. 14 and 15 the pairs 39a of trenches 35a may also be arranged as, e.g., rectangular grid which can be seen from FIG. 16. The grid includes a first group of parallel pairs 39a of trenches 35a and a second group of parallel pairs 39a of trenches 35a, wherein the trenches 35a of the first group and the trenches 35a of the second group run perpendicular to one another. Just as FIG. 14, also FIG. 16 is a possible horizontal cross-sectional view of the device according to FIGS. 9 and 10 in a section plane G of FIG. 10.

In the preceding figures the possible arrangement of trenches in a connecting element has been exemplary explained in particular with reference to the cathode-sided connecting element 30a. However, as well the anode-sided connecting element 30b as, with respect to the arrangement of the trenches and with respect to the possibilities to form trenches by assembling several pieces according to FIGS. 4, 5 and 8, the compensating elements 40a, 40b may be designed according to the preceding figures. Thereby, within one semiconductor arrangement one, some or all of the connecting elements 30a, 30b and compensating elements 40a, 40b may includes trenches 35a, 35b, respectively, which are designed in the same or in principle similar manner as described above. In particular, a compensating element 40a, 40b may be replaced by a stack of such compensating elements having the same structure but reduced thickness, wherein the thickness of the stack may be less than or equal to the thickness of the replaced compensating element 40a, 40b.

At least one of the compensating elements of such a stack may be made from or include molybdenum. The remaining compensating elements of the stack may be made from or include copper or silver. The thickness of the at least one compensating element 40a which includes or which is made from molybdenum and which is arranged cathode-sided is about one third of the thickness of a compensating element 40b which includes or which is made from molybdenum and which is arranged anode-sided.

Generally, the mentioned materials for producing the connecting elements 30a, 30b and compensating elements 40a, 40b are exemplary only. Likewise, other materials, particularly metals and alloys, may be used.

As a result of the trenches 35a, 35b in the connecting elements 30a, 30b, respectively, compared with conventional semiconductor arrangements, the thicknesses of the compensating elements 40a and 40b may be reduced. Accompanied by the reduction of thickness the electric resistance, the weight and the costs also reduce. Further, due to partitioning the connecting elements 30a, 30b into sections 31a and 31b, respectively, the mentioned abrasion also reduces. A further advantage of the trenches 35a, 35b is that the relative sliding movement between adjacent pressure contacted components, e.g., between the connecting element 30a and the compensating element 40a and/or between the connecting element 30b and the compensating element 40b is reduced.

If desired, additional compensating elements and/or connecting elements, e.g., made of or including copper or silver, may be arranged between the semiconductor element 10 and the compensating elements 40a and/or 40b, and/or between the connecting element 35a and the compensating element 40a, and/or between the connecting element 35b and the compensating element 40b. Such additional connecting elements may also have trenches as described above.

The trenches may be manufactured by milling, turning, stamping a blank or by assembling prepared pieces, wherein the blank or the prepared pieces, e.g., may be made of or consist copper, silver or molybdenum.

The arrangement of the semiconductor element 10 and the compensating elements 40a, 40b may be free floating, i.e. the contact between the semiconductor element 10 and the compensating elements 40a, 40b is obtained by external pressure, e.g., 7.9 MPa (equivalent to a pressure of 100 kN applied to a semiconductor element having a diameter of 5 inches 12.7 cm), only.

The connection between at least one of the faces 11, 12 of the semiconductor element 10, e.g., the anode-sided face 12, and the corresponding compensation element 40a, 40b may be an alloy manufactured at a temperature of less than 300° C. or greater than 500° C. The opposite contact between the semiconductor element 10 and the respective compensation element 40b, 40a may either be an alloy as described above, or free floating.

All compensating elements 40a, 40b and the semiconductor element 10 form a pellet which is contacted by the connecting elements 30a, 30b. Particularly, the anode-sided connecting element 30b may contact the anode-sided compensating element 40b directly. The cathode-sided connecting element 30a may directly contact the cathode-sided compensating element 40a or a further compensating element which is arranged between the pellet and the cathode-sided connecting element 30a, and which may be made from or includes copper or aluminum.

In the preceding figures the invention has been described by reference to semiconductor arrangements whose semiconductor element 10 is designed as thyristor element. Instead of a thyristor element the semiconductor element may also be designed as diode. In case of a diode the lead through 23 in FIGS. 1, 2, 4, 6 and 9 is dispensable.

Figure 17:
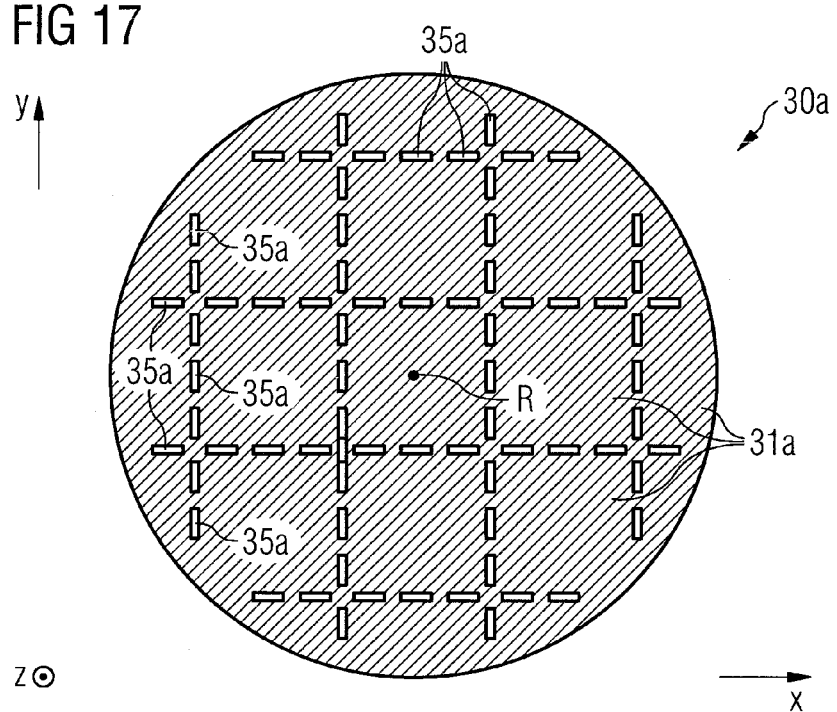
FIG. 17 illustrates, according to FIG. 11, a horizontal cross-sectional view of a section through a connecting element in a section plane A-A according to FIG. 3, in a section plane B-B according to FIG. 5, in section planes C-C and D-D according to FIG. 7 and in section planes E-E and F-F according to FIG. 10, wherein, different from FIG. 11, the several trenches run in a straight line and are spaced apart from one another.

According to FIG. 11, FIG. 17 illustrates a horizontal cross-sectional view of a connecting element 30a through section planes A in FIG. 3, B in FIG. 5, C and D in FIGS. 7 and 8, E and F in FIG. 10. As in FIG. 11 the connecting element 30a includes at least two trench sections, wherein any two of these trench sections may be arranged either parallel or rectangular to one another. Different from FIG. 11, some of the trenches 35a in FIG. 17 run in a straight line and are spaced apart from one another. In this way, the connecting element 30a includes a number of such straight lines, wherein optionally any to of such straight lines may be arranged either parallel or rectangular to one another.

Figure 18:
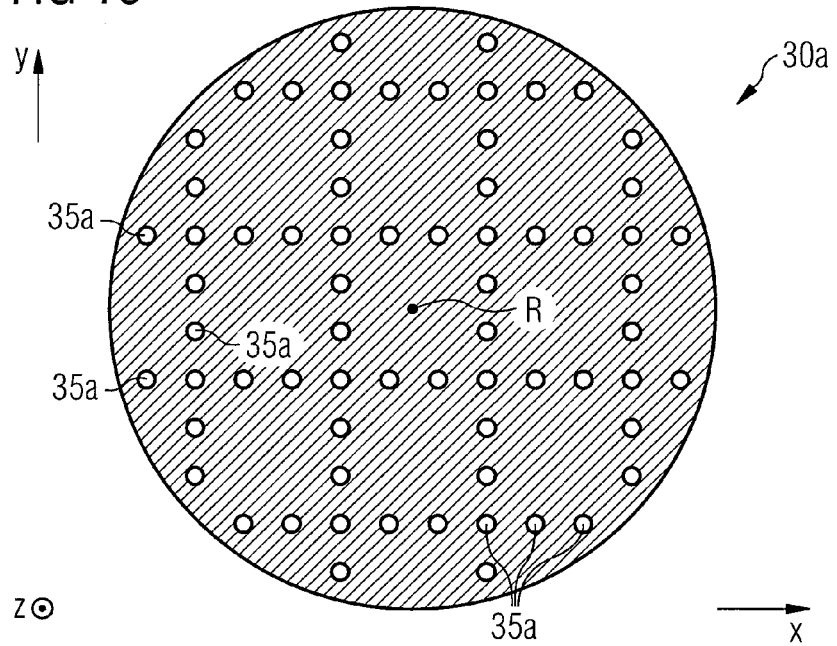
FIG. 18 illustrates a cross-sectional view of a connecting element according to FIG. 17, wherein the trenches are formed as bore holes.
Figure 19:
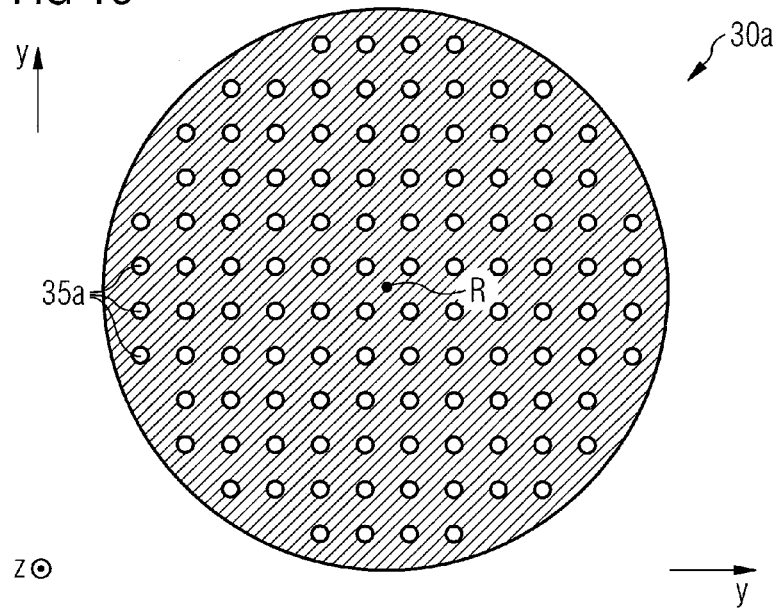
FIG. 19 illustrates a cross-sectional view of a connecting element according to FIG. 17, wherein the bore holes are located at the cross points of a rectangular grid.
Figure 20:
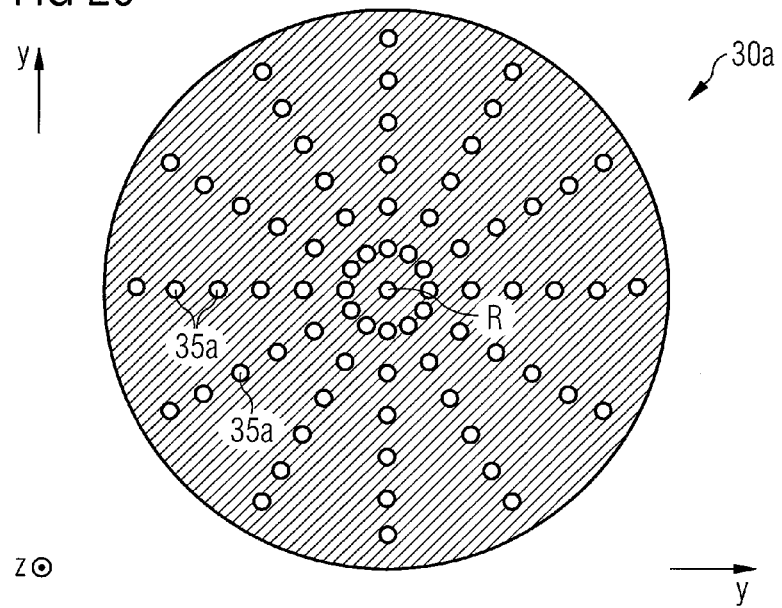
FIG. 20 illustrates a cross-sectional view of a connecting element according, wherein the bore holes run in straight lines, wherein the straight lines are arranged like spokes.

As illustrated in FIG. 18, a trench 35a may also be formed as a bore hole. Such bore holes may be arranged, e.g., in the same way as the trenches 35a in FIG. 17, e.g., in straight lines. In particular, referring to FIG. 19, the boreholes 35a may be located at the cross points of a rectangular grid. As illustrated in FIG. 20, in a further embodiment the bore holes 35a may be arranged along straight lines, wherein the straight lines are arranged like spokes running in different lateral directions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a semiconductor arrangement comprising:
a semiconductor element having a first contact face and a second contact face, the first contact face and the second contact face extending in a first lateral direction, the first contact face and the second contact face arranged on opposing sides of the semiconductor element;
first and second electrically conductive connecting elements electrically connecting the semiconductor element on opposing sides of the semiconductor element, the first electrically conductive connecting element having a third contact face, the first contact face facing towards the first electrically conductive connecting element, the second contact face facing towards the second electrically conductive connecting element, the first electrically conductive connecting element electrically conductively connected to the first contact face, and the second electrically conductive connecting element electrically conductively connected to the second contact face, wherein the first and second electrically conductive connecting elements are formed primarily from an electrically conductive material; and
a trench system formed in the first and second electrically conductive connecting elements that divides the first and second electrically conductive elements into substantially uncoupled sections, wherein a first trench of the trench system extends from the third contact face into the first electrically conductive connecting element.

2. The integrated circuit of claim 1, comprising wherein the third contact face is arranged between the second contact face and a fourth contact face.

3. The integrated circuit of claim 1, comprising wherein a fourth contact face is arranged between the second contact face and the third contact face.

4. The integrated circuit of claim 1, comprising where the trench system includes at least two trench sections which run in different lateral directions.

5. The integrated circuit of claim 1, comprising wherein a second trench extends from a fourth contact face into the first electrically conductive connecting element opposite the first trench, and wherein the first trench and the second trench each extend only partially into the electrically conductive connecting element.

6. The integrated circuit of claim 1, comprising:
a second trench that is separate and distinct from the first trench and that extends from a fourth contact face into the first electrically conductive connecting element, wherein the first trench and the second trench each extend only partially into the first electrically conductive connecting element;
the first trench has a first depth and the second trench has a second depth;
the first electrically conductive connecting element has thickness which is measured in a vertical direction between the third contact face and the fourth contact face; and
wherein the sum of the first depth and the second depth is equal to or greater than the thickness of the first electrically conductive connecting element.

7. A semiconductor arrangement comprising:
a substantially flat semiconductor element having a first contact face and a second contact face opposite the first contact face, the first contact face and the second contact face extending in a first lateral direction, the first contact face and the second contact face arranged on opposing sides of the semiconductor element;
first and second electrically conductive connecting elements electrically connecting the semiconductor element on opposing sides of the semiconductor element, the first electrically conductive connecting element having a third contact face and a fourth contact face opposite the third contact face, the first contact face facing towards the first electrically conductive connecting element, the second contact face facing towards the second electrically conductive connecting element, the first electrically conductive connecting element electrically conductively connected to the first contact face, and the second electrically conductive connecting element electrically conductively connected to the second contact face, wherein a trench system is formed in the first and second electrically conductive connecting elements that divides the first and second electrically conductive elements into substantially uncoupled sections, wherein the first and second electrically conductive connecting elements are formed primarily from an electrically conductive material, and where the trench system includes at least two trench sections which run in different lateral directions and/or where the trench system includes at least two trenches which are spaced apart from one another; and
wherein a first trench of the trench system extends from the third contact face into the first electrically conductive connecting element.

8. The semiconductor arrangement of claim 7, comprising wherein the third contact face is arranged between the second contact face and the fourth contact face.

9. The semiconductor arrangement of claim 7, comprising wherein the fourth contact face is arranged between the second contact face and the third contact face.

10. The semiconductor arrangement of claim 7, comprising wherein the distance between the bottom of the first trench and the fourth contact face is in the range from 0.2 mm to 5 mm.

11. The semiconductor arrangement of claim 7, comprising wherein a second trench extends from the fourth contact face into the first electrically conductive connecting element opposite the first trench.

12. The semiconductor arrangement of claim 11, comprising wherein the distance between the bottom of the first trench and the bottom of the second trench is in the range from 0.2 mm to 5 mm.

13. The semiconductor arrangement of claim 7, comprising:
a second trench extends from the fourth contact face into the first electrically conductive connecting element;
the first trench has a first depth and the second trench has a second depth;
the first electrically conductive connecting element has thickness which is measured in a vertical direction between the third contact face and the fourth contact face; and
wherein the sum of the first depth and the second depth is equal to or greater than the thickness of the first electrically conductive connecting element.

14. The semiconductor arrangement of claim 13, comprising wherein the first trench and the second trench have a distance in the range from 0.2 mm 2 mm in the first lateral direction.

15. The semiconductor arrangement of claim 7, comprising wherein the first trench has a width from one percent to 10 percent of the thickness of the first electrically conductive connecting element.

16. The semiconductor arrangement of claim 7, comprising wherein the first trench runs laterally in a ring shape.

17. The semiconductor arrangement of claim 7, comprising wherein the first trench and the second trench are configured as circular rings and arranged coaxial.

18. The semiconductor arrangement of claim 7, comprising wherein a third trench extends from the third contact face into the first electrically conductive connecting element.

19. The semiconductor arrangement of claim 18, comprising wherein the first trench and the third trench run laterally in ring shapes that are arranged coaxial.

20. The semiconductor arrangement of claim 7, comprising wherein the trench system includes at least two trench sections which run parallel to one another.

21. The semiconductor arrangement of claim 7, comprising wherein the trench system includes two trench sections which run rectangular to one another.

22. The semiconductor arrangement of claim 7, wherein the trench system includes at least two trench sections, wherein any two of these trench sections are arranged either parallel or rectangular to one another.

23. The semiconductor arrangement of claim 7, comprising wherein the trench system includes at least two trenches which run in a line and which are spaced apart from one another.

24. The semiconductor arrangement of claim 7, comprising wherein the trench system includes at least two trenches which run in a straight line and which are spaced apart from one another.

25. The semiconductor arrangement of claim 7, comprising wherein the trench system is shaped as a grid.

26. The semiconductor arrangement of claim 7, comprising wherein the trench system is shaped as a rectangular grid.

27. The semiconductor arrangement of claim 7, wherein the trench system comprises at least two trenches which are formed as boreholes and which are spaced apart from one another.

28. The semiconductor arrangement of claim 27, comprising wherein the boreholes are arranged in a straight line.

29. The semiconductor arrangement of claim 27, comprising wherein the boreholes are located at the cross points of a rectangular grid.

30. The semiconductor arrangement of claim 7, comprising wherein the first electrically conductive connecting element is made in one piece.

31. The semiconductor arrangement of claim 7, comprising wherein the connecting element includes at least two pieces which are spaced apart from one another and which are connected by a common plate which is arranged at the side of the connecting element opposite the third contact face.

32. The semiconductor arrangement of claim 7, comprising wherein the connecting element includes at least four pieces which are spaced apart from one another and connected by a common plate, wherein a first of these pieces and a second of these pieces is arranged at the side of the connecting element opposite the third contact face and wherein a third of these pieces and a fourth of these pieces is arranged at the side of the connecting element opposite the fourth contact face.

33. The semiconductor arrangement of claim 7, comprising wherein the first electrically conductive connecting element includes at least one of the elements aluminum (Al), copper (Cu), silver (Ag) or molybdenum (Mo).

34. The semiconductor arrangement of claim 7, comprising wherein the first electrically conductive connecting element consists of one of the elements aluminum, copper, silver or molybdenum.

35. The semiconductor arrangement of claim 7, and further comprising a compensating element which is made of molybdenum or which includes molybdenum.

36. The semiconductor arrangement of claim 35, comprising wherein the compensating element is fixedly joined to a metallization of the semiconductor element.

37. The semiconductor arrangement of claim 7, comprising wherein the semiconductor element has a dimension of at least 4 inches in the first lateral direction.

38. A semiconductor arrangement comprising:
a substantially flat semiconductor element having a first contact face and a second contact face opposite the first contact face, the first contact face and the second contact face extending in a first lateral direction;
an electrically conductive connecting element electrically connecting the semiconductor element and having a third contact face, a fourth contact face opposite the third contact face, and a trench system formed in the electrically conductive connecting element, wherein the electrically conductive connecting element is formed primarily from an electrically conductive material, and where the trench system includes at least two trench sections which run in different lateral directions and/or where the trench system includes at least two trenches which are spaced apart from one another; and
wherein a first trench of the trench system extends from the third contact face into the connecting element, wherein a third trench extends from the third contact face into the connecting element, and wherein the first trench and the third trench run laterally in ring shapes that are arranged coaxial.

* * * * *